United States Patent
Ono et al.

[11] Patent Number: 5,360,470
[45] Date of Patent: Nov. 1, 1994

[54] MAGNETIC LEVITATING TRANSPORTING APPARATUS WITH A MOVABLE MAGNETIC UNIT

[75] Inventors: Yoshinobu Ono; Yoshio Watanabe; Shinjiro Tanida; Tadayuki Kojima, all of Kawasaki, Japan

[73] Assignee: Fujitsu Limited, Kawasaki, Japan

[21] Appl. No.: 183,316

[22] Filed: Jan. 19, 1994

Related U.S. Application Data

[63] Continuation-in-part of Ser. No. 86,033, Jul. 6, 1993.

[30] Foreign Application Priority Data

| Jul. 6, 1992 | [JP] | Japan | 4-178636 |
| Jun. 15, 1993 | [JP] | Japan | 5-143660 |
| Nov. 22, 1993 | [JP] | Japan | 5-292035 |

[51] Int. Cl.⁵ ............................. B60L 13/06
[52] U.S. Cl. ................................. 104/284
[58] Field of Search ............. 104/281, 283, 284

[56] References Cited

U.S. PATENT DOCUMENTS

| 4,732,087 | 3/1988 | Morishita et al. | 104/284 X |
| 4,787,317 | 11/1988 | Bohn et al. | 104/281 |
| 4,972,779 | 11/1990 | Morishita et al. | 104/284 |
| 5,067,415 | 11/1991 | Morishita et al. | 104/284 X |
| 5,140,208 | 8/1992 | Tozoni | 104/281 X |

FOREIGN PATENT DOCUMENTS

| 53-018115 | 2/1978 | Japan | 104/284 |
| 54-009807 | 1/1979 | Japan | 104/284 |
| 61-116908 | 6/1986 | Japan | 104/284 |
| 61-142905 | 6/1986 | Japan | 104/284 |
| 62-031304 | 2/1987 | Japan | 104/284 |
| 03-027704 | 2/1991 | Japan | 104/284 |

*Primary Examiner*—Robert J. Oberleitner
*Assistant Examiner*—S. Joseph Morano
*Attorney, Agent, or Firm*—Staas & Halsey

[57] ABSTRACT

A magnetic levitating transportation apparatus comprising a rail and a vehicle capable of travelling along the rails by a linear motor and caused to magnetically levitate by magnet units including permanent magnets and electro-magnets. The gap between the rail and each of the magnetic units is controlled by controlling the current supplied to the magnet units so that the current is substantially zero when the vehicle is in the levitated condition. One of the magnet units is movably mounted to the vehicle and moved by the piezoelectric actuator so that the gap between this magnet unit and the rail can be adjusted. The controller controls the piezoelectric actuator based on the current supplied to the magnet units.

9 Claims, 9 Drawing Sheets

MAGNETIC LEVITATING TRANSPORTING APPARATUS WITH A MOVABLE MAGNETIC UNIT

CROSS REFERENCE TO THE RELATED APPLICATION

This is a continuation-in-part application of patent application Ser. No. 08/086,033, filed on Jul. 6, 1993 pending.

BACKGROUND OF THE INVENTION

1. Field of the Invention

The present invention relates to a magnetic levitating transportation apparatus including a vehicle capable of travelling along a rail.

2. Description of the Related Art

In recent semiconductor manufacturing industries, wafers are often automatically transported in wafer treatment processes so that the wafers are contaminated by as little dust as possible. A magnetic levitating transportation apparatus such as a linear motor car is suitable for an automatic transportation apparatus for wafers because there is no friction between the vehicle and the rail and thus dust is not generated, and it is possible to transport wafers quickly and reliably.

The magnetic levitating transportation apparatus includes a vehicle capable of being levitated relative to a rail installed along a predetermined path with a gap between the vehicle and the rail. The vehicle travels along the rail. The vehicle is driven along the rail by a linear motor and caused to magnetically levitate by magnet units which are arranged on the vehicle. Also, gap sensors are arranged on the vehicle for detecting the gap between the vehicle and the rail to control the current supplied to the magnet units to maintain the gap between the vehicle and the rail at a desired constant value.

Four magnet units, for example, are arranged on the vehicle. Each magnetic unit is of a composite structure comprising a permanent magnet and electro-magnets. A relatively large current is supplied to the coils of the electro-magnets at the initial stage of levitation of the vehicle so that the vehicle is quickly levitated by the sum of the magnetic forces of the permanent magnet and the electro-magnets, and the current supplied to the coils of the electro-magnets is gradually reduced as the vehicle levitates. The vehicle finally levitates with a constant gap between the vehicle and the rail. It is also possible to supply the current to the coils in the reverse direction, so that a difference between the magnetic forces of the permanent magnet and the electro-magnets acts on the vehicle and the vehicle so as to enlarge the gap between the vehicle and the rail.

It is desirable that the final gap between the vehicle and the rail be such that the current supplied to the electro-magnets of the magnet units is substantially zero and the vehicle is supported by the magnetic force of only the permanent magnets. That is, if the weight of the vehicle balances the magnetic force of the permanent magnets, it is possible to minimize the current supplied to the electro-magnets of the magnet units and thus to minimize power consumption from the battery mounted in the vehicle.

Four magnet units, for example, are arranged on the vehicle in a common plane. The current is controlled separately for each of the magnet units. The vehicle may not necessarily be parallel to the rail depending on the position of the vehicle and the position of the load on the vehicle. Therefore, the gap between one magnet unit and the rail when the current supplied to one magnet unit becomes substantially zero may differ from the gap between another magnet unit and the rail when the current supplied to the latter magnet unit becomes substantially zero. For example, the gap between one magnet unit and the rail when the current supplied to one magnet unit becomes substantially zero may be approximately 1.8 mm, while the gap between another magnet unit and the rail when the current supplied to the latter magnet unit becomes substantially zero may be approximately 1.9 mm.

In the case where four magnet units are arranged in a common plane, a problem arises that it is not possible to reduce the current supplied to all electro-magnets of the magnet units to substantially zero. For example, when the gaps of three magnet units are determined, the gap of the fourth magnet unit is automatically determined from the relationship of the plane. However, this determined gap of the fourth magnet may not necessarily correspond to the gap at which the current can be reduced to zero. Therefore, it is not possible to reduce the current supplied to the electro-magnets of the last magnet unit.

SUMMARY OF THE INVENTION

The object of the present invention is to provide a magnetic levitating transportation apparatus including a vehicle and magnet units with electro-magnets in which a current supplied to the electro-magnets of all the magnet units can be reduced to substantially zero with the vehicle in a levitated condition, whereby the power consumption from the battery mounted in the vehicle can be minimized.

According to the present invention, there is provided a magnetic levitating transportation apparatus comprising a rail means; a vehicle capable of travelling along the rail means; a plurality of magnet units arranged on the vehicle for causing the vehicle to magnetically levitate relative to the rail means, each of the magnet units comprising at least one electro-magnet and at least one permanent magnet; mounting means for movably mounting at least one of the magnet units to the vehicle so that a gap between at least one magnet unit and the rail means can be adjusted; actuating means for adjusting a gap between at least one magnet unit and the rail means; a gap detecting means arranged on or near each of the magnet units for detecting a gap between the rail means and the magnet unit; current calculating means for calculating a current supplied to each of the magnet units in response to an output of the gap detecting means; and control means for controlling the actuating means based on the current supplied to the magnetic units.

With this arrangement, at least one of the magnet units is movably mounted to the vehicle so that a gap between at least one magnet unit and the rail means can be adjusted. Therefore, the current is first controlled so that the current supplied to three magnetic units, for example, is substantially zero, and these magnetic units can be arranged with separate gaps relative to the rail. Then the position of the fourth magnet unit can be calculated and adjusted based on the current supplied thereto, and the current supplied to the latter magnet unit can be reduced to zero.

BRIEF DESCRIPTION OF THE DRAWINGS

The present invention will become more apparent from the following description of the preferred embodiments, with reference to the accompanying drawings, in which.

DESCRIPTION OF THE PREFERRED EMBODIMENTS

Figure 3:
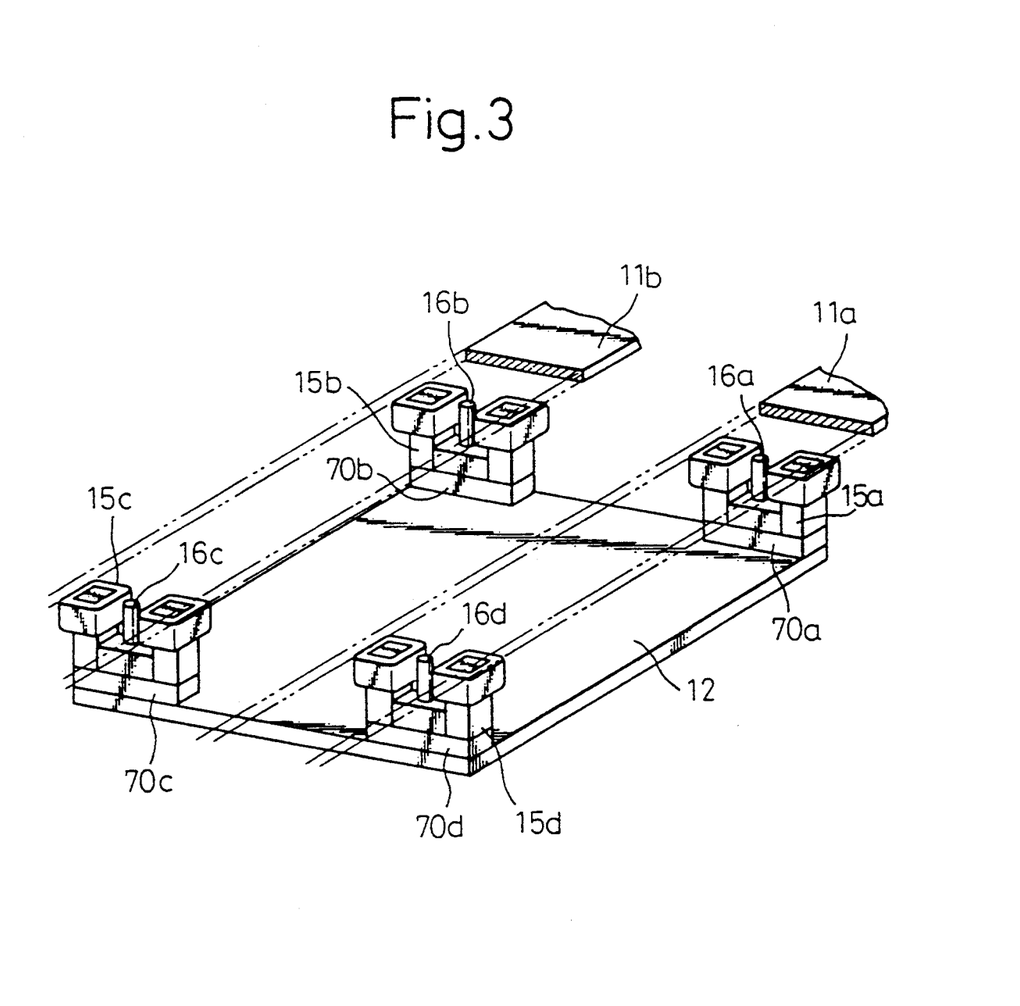
FIG. 3 is a diagrammatic perspective view of the magnetic levitating transportation apparatus according to the embodiment of the present invention.
Figure 4:
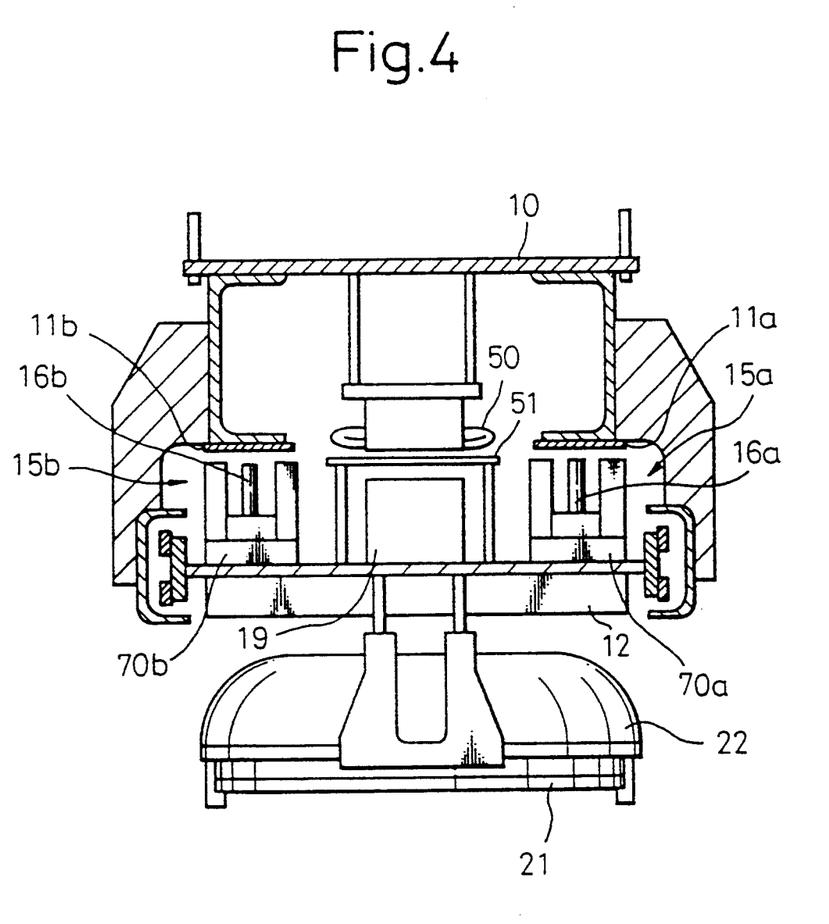
FIG. 4 is a cross-sectional view of the apparatus of FIG. 3.

FIGS. 3 and 4 show a magnetic levitating transportation apparatus according to the embodiment of the present invention. The magnetic levitating transportation apparatus comprises two parallel rail elements 11a and 11b of a magnetic material suspended from a ceiling 10, and a vehicle 12 capable of travelling along the rail elements 11a and 11b without contacting the rail elements 11a and 11b. A linear motor is provided for driving the vehicle 12, the linear motor including a primary winding 50 suspended from the ceiling 10 between the rail elements 11a and 11b, and a secondary conductor plate 51 arranged at the center of the vehicle 12. Accordingly, the vehicle 12 can travel along the rail elements 11a and 11b.

Figure 5:
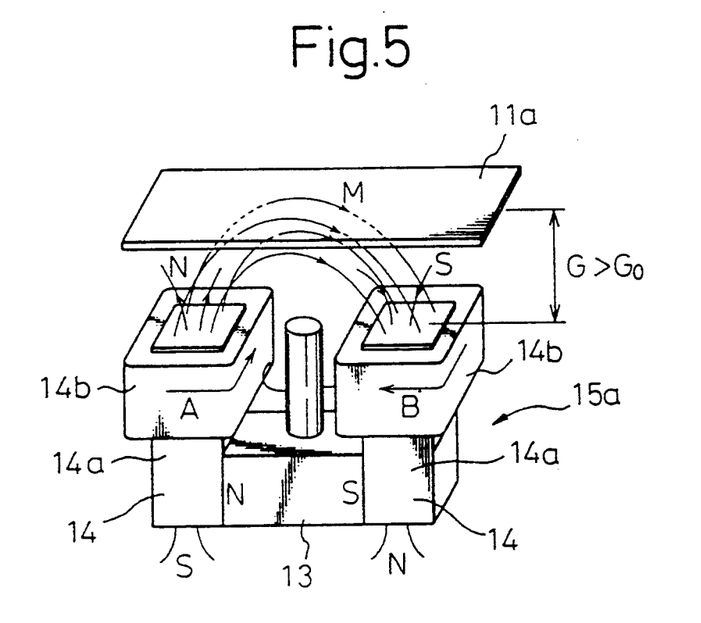
FIG. 5 is a perspective view of the magnet unit.
Figure 6:
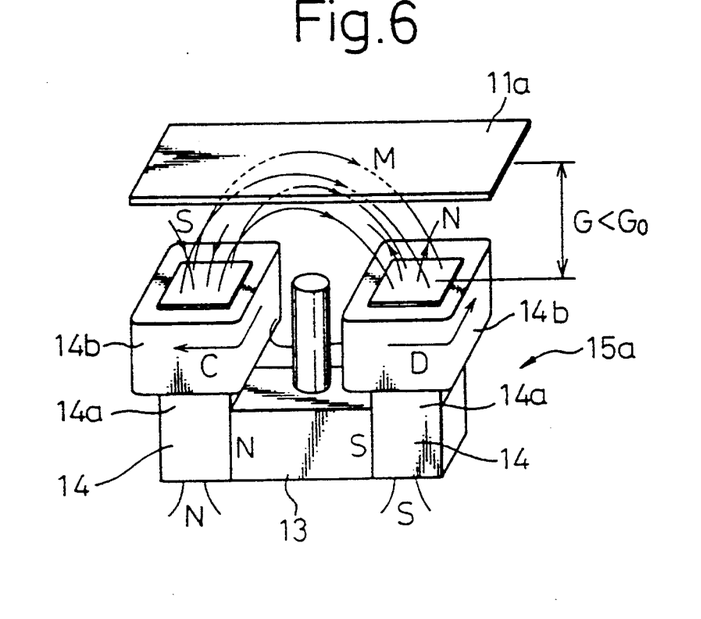
FIG. 6 is a view similar to FIG. 5, illustrating a case when the current is supplied in the reverse direction.

Four magnet units 15a to 15d are arranged on the vehicle 12 for causing the vehicle 12 to magnetically levitate relative to the rail elements 11a and 11b, so that four magnet units 15a to 15d form a quadrilateral arrangement. Each of the magnet units 15a to 15d is of a composite structure comprising a central permanent magnet 13 and two electro-magnets 14 standing on either side of the central permanent magnet 13, arranged in a U-shape, as shown in FIGS. 5 and 6. A gap G exists between the rail element 11a and the tops of the electro-magnets 14. Each electro-magnet 14 comprises an iron core 14a and a coil 14b wound around the iron core 14a, and generates a magnetic flux so as to penetrate the iron core 14a by supplying a current to the coil 14b. The permanent magnet 13 has a N-pole and a S-pole, and the lines of magnetic force starting from the N-pole of the permanent magnet 13 pass through the left electro-magnet 14 and the right electro-magnet 14 to the S-pole of the permanent magnet 13, as shown by the arrows M in FIGS. 5 and 6.

In FIG. 5, a current is supplied to the coils 14b of the electro-magnets 14, in the direction of the arrows A and B, respectively, so that the electro-magnets 14 generate the lines of magnetic force in the same direction as that of the permanent magnet 13. Therefore, the vehicle is attracted to the rail elements 11a and 11b by the sum of the magnetic force of the permanent magnet 13 and the magnetic force of the electro-magnets 14. This is mainly adapted for the case when the gap G is greater than a predetermined value $G_0$, to cause the vehicle 12 to be attracted toward the rail elements 11a and 11b.

In FIG. 6, a current is supplied to the coils 14b of the electro-magnets 14, in the direction of the arrows C and D, respectively, the reverse of FIG. 5, so that the electro-magnets 14 generate lines of magnetic force in the reverse direction to that of the permanent magnet 13. Therefore, the vehicle is attracted to the rail elements 11a and 11b by only the difference between the magnetic force of the permanent magnet 13 and the magnetic force of the electro-magnets 14. This is mainly adapted for the case when the gap G is smaller than a predetermined value $G_0$, causing the vehicle 12 to be moved away from the rail elements 11a and 11b.

As shown in FIGS. 3 and 4, the magnetic units 15a to 15d comprising the permanent magnets 13 and the electro-magnets 14, respectively, are mounted to the vehicle 12 by mounting members 70a to 70d, respectively. Three mounting members 70a to 70c fixedly mount the respective magnetic units 15a to 15c to the vehicle 12. The remaining mounting member 70d movably mounts the associated magnetic unit 15d to the vehicle 12. This mounting member 70d has a piezoelectric actuator 70p (FIG. 1) incorporated therein, the piezoelectric actuator 70p serving as an actuating means for adjusting the gap between the magnetic unit 15d and the rail element 11a.

Gap sensors 16a to 16d are arranged on the permanent magnets 13 of the magnet units 15a to 15d, respectively. It is possible to use several types of gap sensors 16a to 16d. For example, it is possible to use an optical type gap sensor comprising a light emitter and a light receiver, or a magnetic type gap sensor comprising a high frequency emitting coil and a high frequency detecting coil. These gap sensors 16a to 16d are known. For example, in the optical type gap sensor, a light is emitted from the light emitter to the rail elements 11a and 11b and the light receiver receives the reflected light to detect the gap G.

Figure 1:
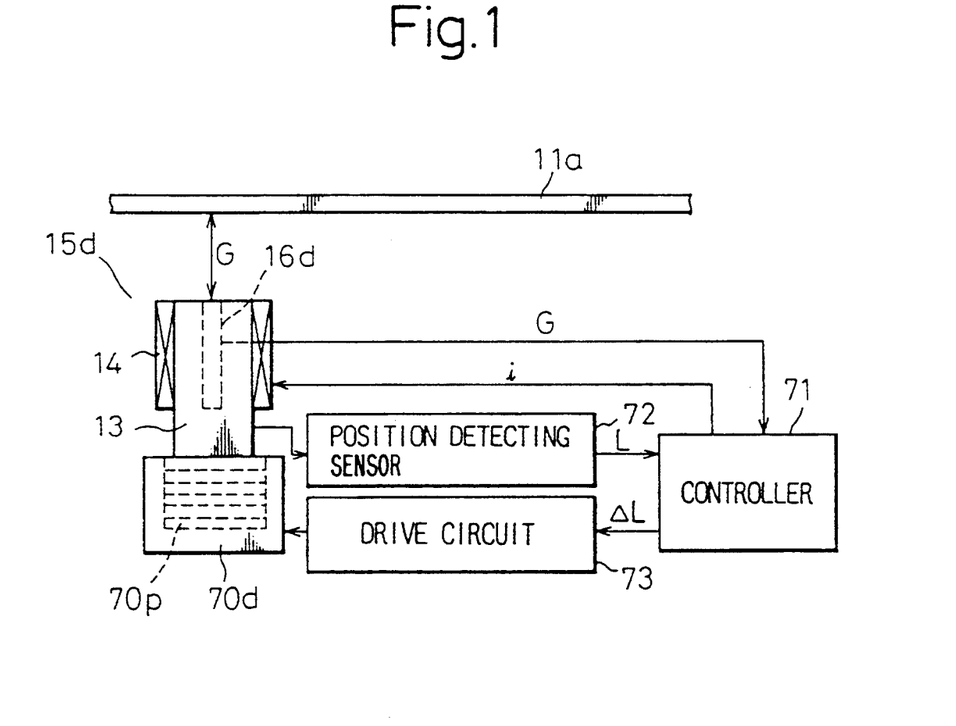
FIG. 1 is a diagrammatic view illustrating the movable magnetic unit of FIG. 3 and the actuating means for the movable magnetic unit.

FIG. 1 shows a controller 71 for controlling the current supplied to the magnetic unit 15d and the position of the magnetic unit 15d. The controller 71 calculates the current i supplied to the magnetic unit 15d in response to the output from the gap sensor 16d and a not shown travelling control signal. Also, the controller 71 calculates the moving distance $\Delta L$ of the magnetic unit 15d in response to the current i supplied to the magnetic unit 15d and the signal L from a position detecting sensor 72 detecting the position of the magnetic unit 15d, and controls the piezoelectric actuator 70p via a drive circuit 73 to move the magnetic unit 15d. The fundamental control of the current supplied to the other magnetic units 15a to 15c is similar to that of the magnetic unit 15d.

Figure 2:
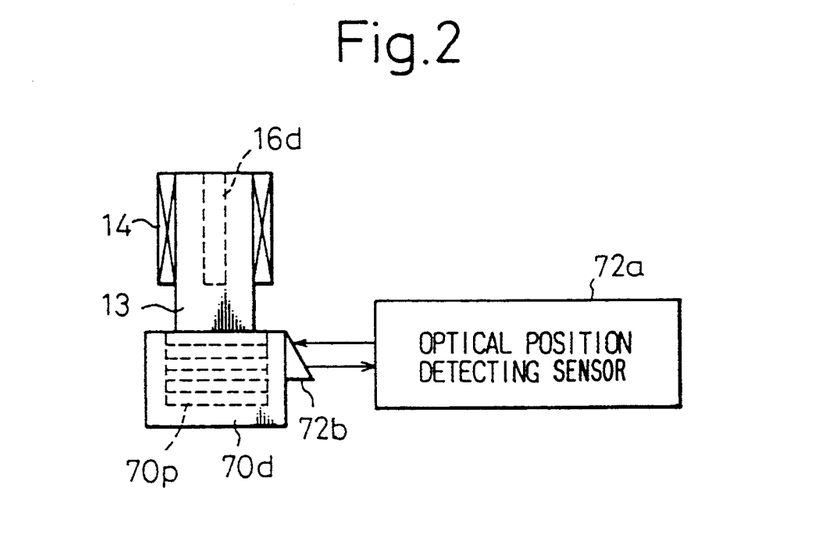
FIG. 2 is a view similar to FIG. 1, illustrating the modified actuating means.

FIG. 2 shows an optical type position detecting sensor 72a. In FIG. 2, an inclined reflecting member 72b is attached to the moving part of the mounting member 70d of the magnet unit 15d, and the position of the magnetic unit 15d is detected by emitting a light from the light emitter in the optical type position detecting sensor 72a to the reflecting member 72b and receiving the reflected light by a light receiver in the optical type position detecting sensor 72a. It is possible to detect the position of the magnetic unit 15d based on the fact that the amount of the reflected light varies depending on the positional relationship between the optical type position detecting sensor 72a and the inclined reflecting member 72b.

Figure 7:
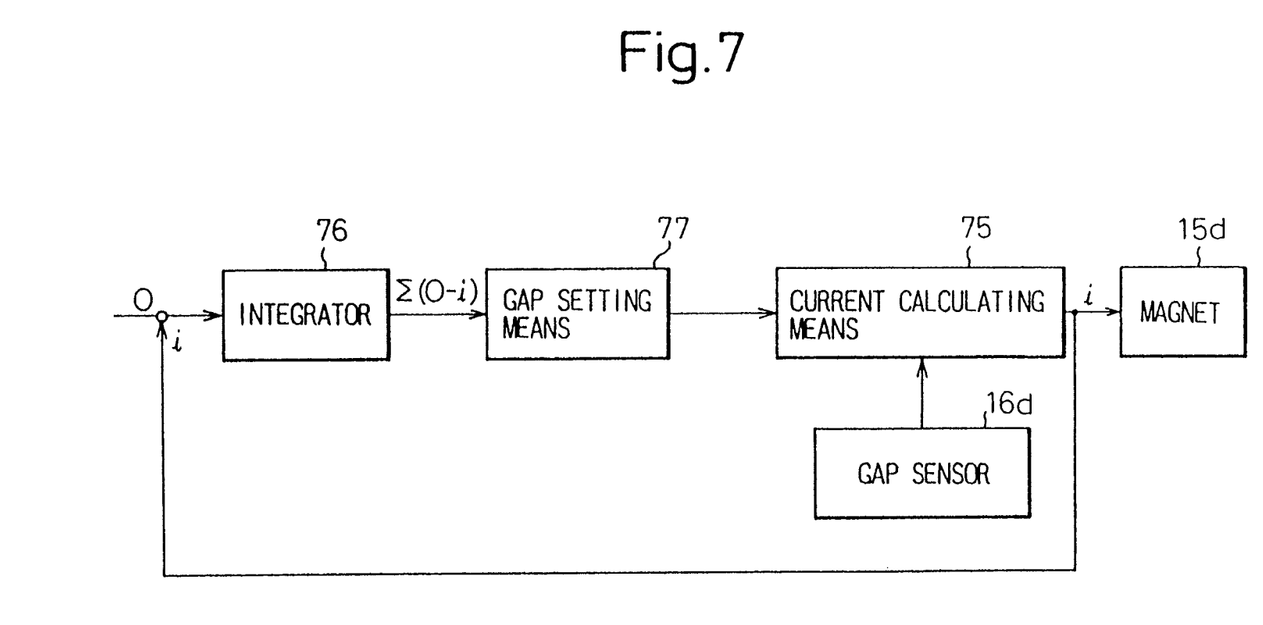
FIG. 7 is a block diagram illustrating the current control means for the magnetic units.

FIG. 7 shows a block diagram of the current control means for the magnetic unit 15d (and of the magnetic units 15a to 15c), this being a part of the controller 71 of FIG. 1. The current control means includes a current calculating means 75 for calculating the current supplied to the magnet unit 15d in response to the output from the gap sensor 16d. The current calculating means 75 receives the current i supplied to the magnet unit 15d as a feedback input to control the current i so that the gap G becomes such a value that the vehicle 12 is supported substantially by the magnetic force only of the permanent magnet 13 of the magnetic unit 15d. In FIG. 7, the feedback current i is input to an integrator 76 and an integrated value of i during a predetermined time $\Sigma$ (0−i) is input to a gap setting means 77. A reference gap $G_0$ is set in the gap setting means 77, the reference gap $G_0$ being used first. The current calculating means 75 calculates the current i to be supplied to the magnet unit 15d from the relationship of the integrated value of i $\Sigma$ (0−i) and the detected gap G.

Figure 8:
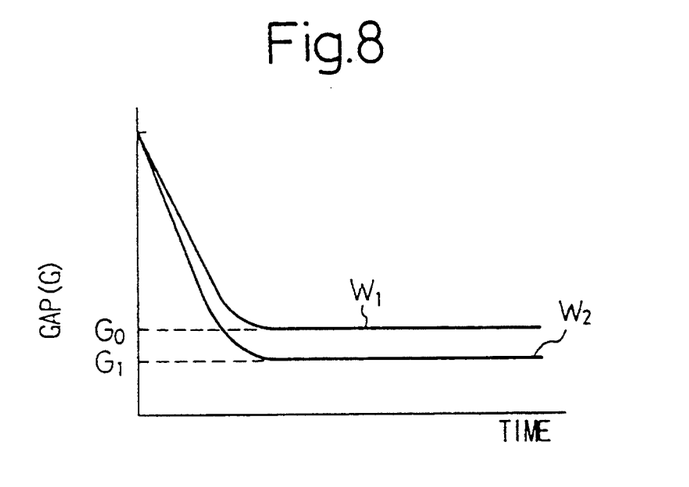
FIG. 8 is a view illustrating the gap between the magnet unit and the rail.
Figure 9:
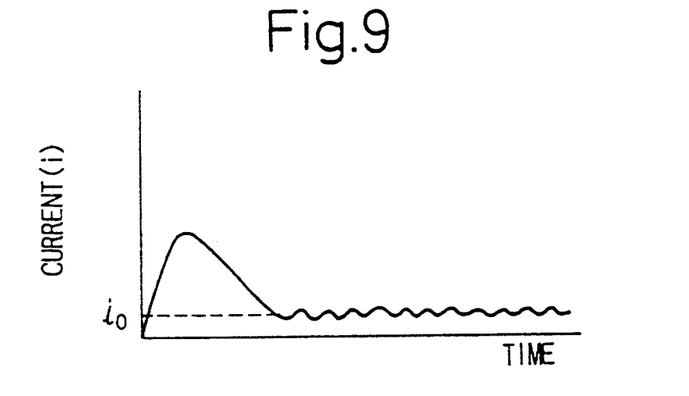
FIG. 9 is a view illustrating the current supplied to the magnet unit.

FIG. 8 shows the gap G between the magnet unit 15d (and 15a to 15c) and the rail element 11a (and 11b) at the initial stage of the magnetic levitation of the vehicle 12. Supposing that the weight of the vehicle 12 is $W_1$ or $W_2$ ($W_1 < W_2$), the lines $W_1$ and $W_2$ in FIG. 8 show the gaps when the weight of the vehicle 12 is $W_1$ and $W_2$, respectively. FIG. 9 shows the current i supplied to magnet units 15a to 15d when the weight of the vehicle 12 is $W_1$, and FIG. 10 shows the current i supplied to magnet units 15a to 15d when the weight of the vehicle 12 is $W_2$.

When a levitation start signal is delivered to the controller 71 by the not shown travelling control device, a current is supplied to the magnet units 15a to 15d in the direction as shown in FIG. 5. The reference gap $G_0$ is selected such that the vehicle 12 is supported by the magnetic force of only the permanent magnets 13 when the weight of the vehicle 12 is $W_1$ and the vehicle 12 is in the stably levitated condition after the start of levitation. Since the vehicle 12 is levitated by four magnet units 15a to 15d, each one of four magnet units 15a to 15d shares one fourth of the weight $W_1$ of the vehicle 12. However, there may be variations in the sharing of one fourth of the weight $W_1$, depending on the position of the load of the vehicle.

Figure 10:
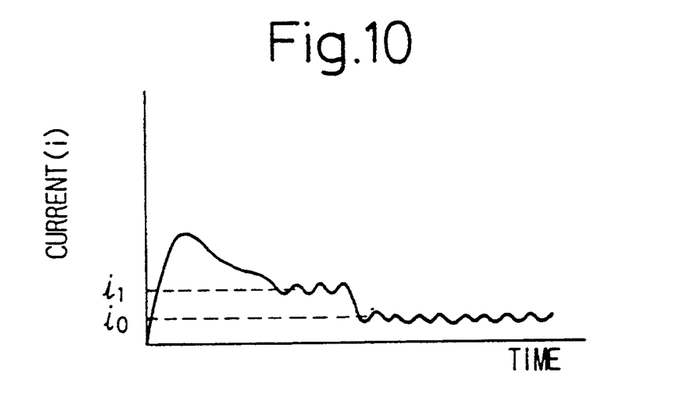
FIG. 10 is a view similar to FIG. 9, illustrating the current supplied to the magnet unit when the vehicle is heavy.

As shown in FIGS. 9 and 10, the current i increases with time and reaches a predetermined peak, and thereafter decreases as the magnetic unit 15a to 15d approaches the rail elements 11a and 11b. The outputs of the gap sensors 16a to 16d are input to the controller at small time intervals, and the current i decreases according to a predetermined relationship between the current i and the difference between the reference gap $G_0$ and the detected gap G.

As shown in FIGS. 8 and 9, in the case of the vehicle 12 having the weight $W_1$, when the detected gap G becomes equal to the reference gap $G_0$, the current i becomes substantially O (=$i_0$), and the vehicle 12 is supported by the magnetic force of only the permanent magnets 13 of the magnetic units 15a to 15d. The current i is controlled within a small range having the center $i_0$, in the direction shown in FIG. 5 and in the direction shown in FIG. 6.

As shown in FIGS. 8 and 10, in the case of the vehicle 12 having the weight $W_2$, when the detected gap G becomes equal to the reference gap $G_0$, the current i becomes a certain value $i_1$ greater than $i_0$. Then, the current i is continuously supplied to the magnetic units 15a to 15d independently of the reference gap $G_0$ so that the actual gap G becomes a value $G_1$ smaller than the reference gap $G_0$ to cause the vehicle 12 to approach the rail elements 11a and 11b. Accordingly, the magnetic force of the permanent magnets 13 acting on the rail elements 11a and 11b becomes greater, and it is possible to decrease the current i to substantially O (=$i_0$), and the vehicle 12 will be supported by the magnetic force of only the permanent magnets 13 of the magnetic units 15a to 15d. In this case too, the current i is controlled within a small range having the center $i_0$, in the direction shown in FIG. 5 and in the direction shown in FIG. 6.

In the case of the vehicle 12 having the weight $W_3$ smaller than $W_1$ ($W_3 < W_1 < W_2$), the current i may become substantially 0 (=$i_0$) before the detected gap G becomes equal to the reference gap $G_0$. That is, in the case of the light vehicle 12, the vehicle 12 is supported by the magnetic force of only the permanent magnets 13 of the magnetic units 15a to 15d, with the gap G greater than the reference gap $G_0$. In this case, the current i is controlled within a small range having the center $i_0$, in the direction shogun in FIG. 5 and in the direction shown in FIG. 6.

In this way, according to the present invention, it is possible to support the vehicle 12 substantially by the magnetic force of only the permanent magnets 13 of the magnetic units 15a to 15d, irrespective of the weight of the vehicle, and thus to prevent excess power consumption of the battery.

As explained previously, one of the magnetic units 15a to 15d, i.e., the magnetic unit 15d is movably mounted to the vehicle 12.

Figure 11:
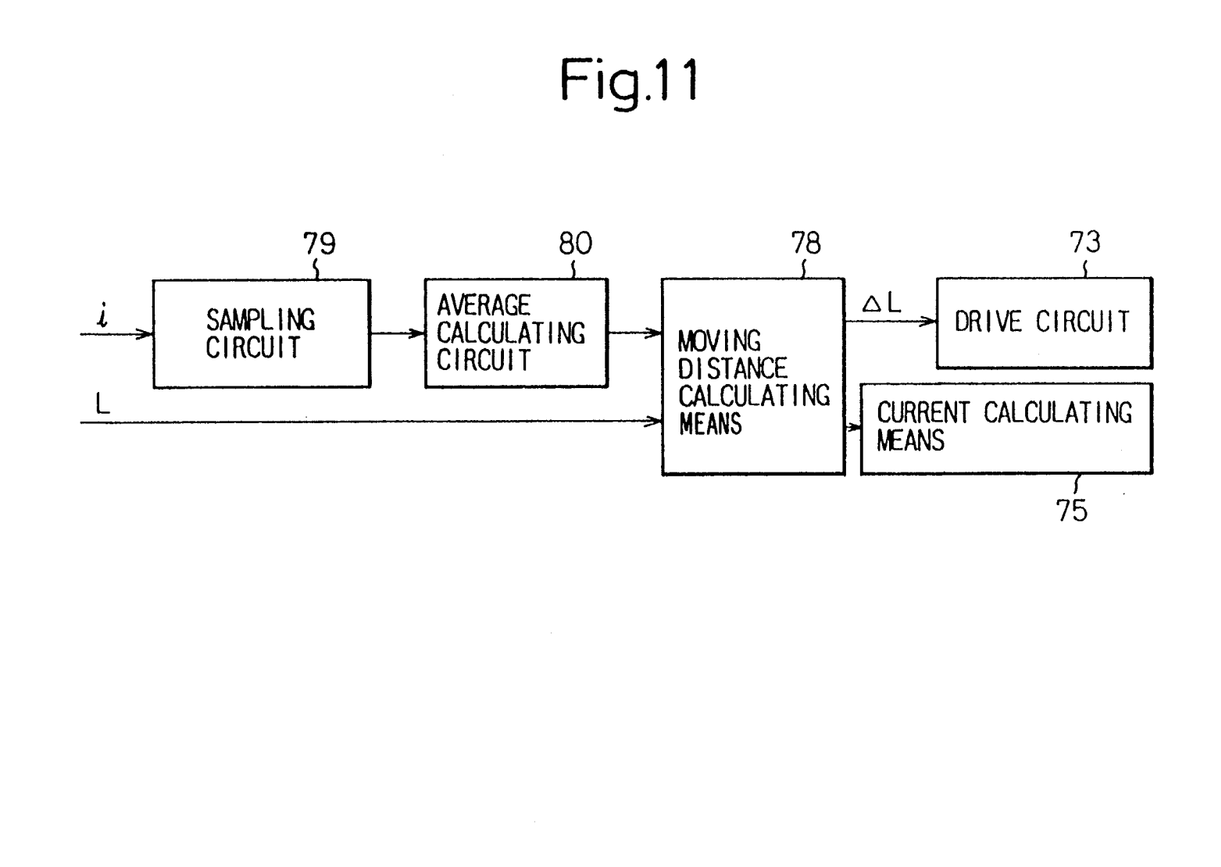
FIG. 11 is a block diagram illustrating control means for the actuating means.

FIG. 11 shows control means for the piezoelectric actuator 70p for moving the magnetic unit 15d, this being also a part of the controller 71 of FIG. 1. This control means includes a moving distance calculating means 78 for calculating the moving distance $\Delta L$ of the magnetic unit 15d based on the current i supplied to the magnetic unit 15d. The signal L from the position detecting sensor 72 and the signal corresponding to the current i supplied to the magnet units 15a to 15d are input to the moving distance calculating means 78. The signal corresponding to the current i is delivered to the controller 71 at small time intervals as described above, and input to a sampling circuit 79. The current signal is then delivered to an average calculating circuit 80, and the average of the current, which will vary within the small range having the center $i_0$, as described with reference to FIGS. 9 and 10, is input to the moving distance calculating means 78.

Figure 12:
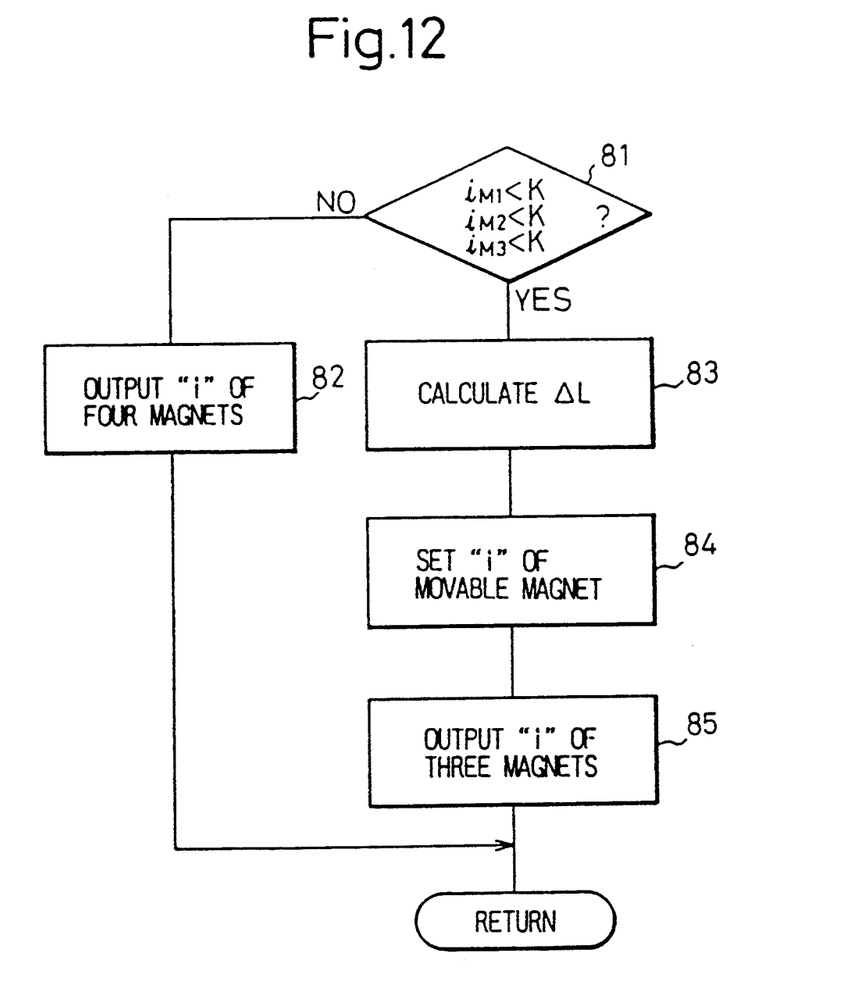
FIG. 12 is a flowchart illustrating the moving control of the movable magnet unit and the current control of the magnet units.

FIG. 12 is a flowchart illustrating the moving control of the movable magnet unit and the current control of the magnet units, carried out in the moving distance calculating means 78. At step 81, it is determined whether or not the average $i_{M1}$, $i_{M2}$, or $i_{M3}$ of the current i of each of three magnet units 15a to 15c is smaller than a predetermined small value k. If the result is YES, it is judged that the current supplied to each of three magnet units 15a to 15c is substantially zero, and (a portion equal to approximately three fourths of) the vehicle 12 is supported substantially by the magnetic force of only the permanent magnets 13 of the magnetic units 15a to 15c. Regarding the remaining magnet unit 15d, this must be located in the common plane where three magnet units 15a to 15c are located, so the current i supplied to the electro-magnets 14 of the magnet unit 15d does not necessarily become zero.

If the result of step 81 is NO, the program proceeds to step 82 to output the respectively calculated current i to the drive circuit of each of four magnet units 15a to 15d.

If the result of step 81 is YES, the program proceeds to step 83 to calculate the moving distance $\Delta L$ of the magnet unit 15d based on the current i being supplied to the magnet unit 15d. The relationship of the moving distance $\Delta L$ and the current i is predetermined.

Figure 13:
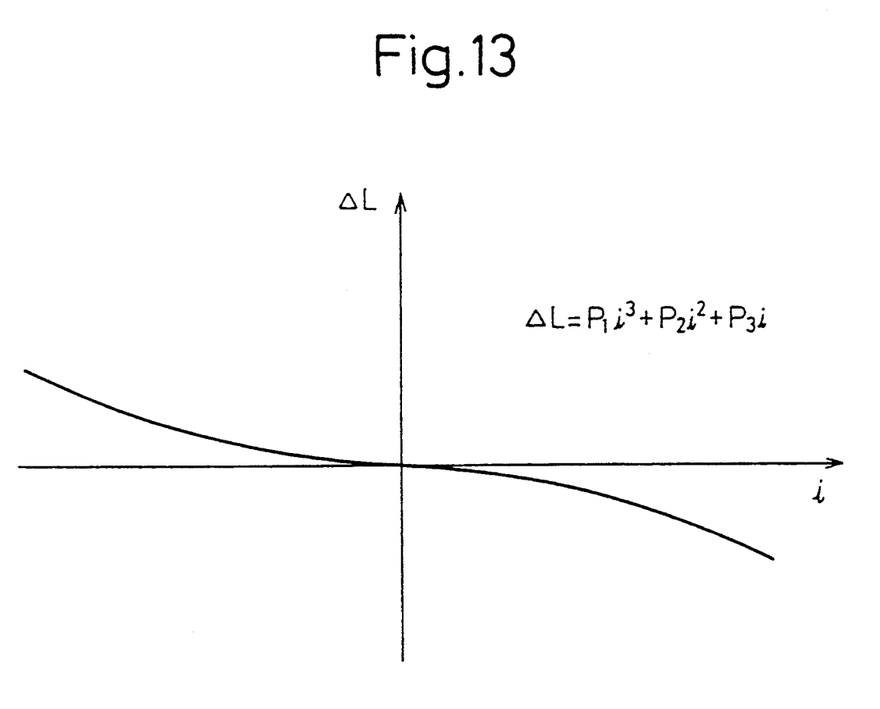
FIG. 13 is a view illustrating the relationship of the moving distance of the movable magnet unit relative to the current.

FIG. 13 shows an example of the relationship of the moving distance $\Delta L$ of the movable magnet unit 15d relative to the current i. Therefore, it is possible to calculate the moving distance $\Delta L$ from this relationship, if the current i being supplied to the magnet unit 15d is known. In FIG. 13, there is a relationship, $\Delta L = P_1 i^3 + P_2 i^2 + P_3 i$, where $P_1$, $P_2$, and $P_3$ are constants. $P_1$, $P_2$, and $P_3$ can be experimentally obtained.

The moving distance $\Delta L$, calculated in this manner, is output to the piezoelectric actuator 70p via the drive circuit 73 of FIGS. 1 and 11, to move the magnet unit 15d toward or away from the rail element 11a. The program then proceeds to step 84, to set the current supplied to the magnet unit 15d to zero. The program then proceeds to step 85 to output the respectively calculated current i to the drive circuit of each of three magnet units 15a to 15c. These current values are substantially zero.

As explained in detail, according to the present invention, it is possible to minimize the current supplied to the magnet units and thus to minimize the power consumption of the battery.

We claim:

1. A magnetic levitating transportation apparatus comprising:
   a rail;
   a vehicle capable of travelling along the rail;
   a plurality of magnet units arranged on the vehicle for causing the vehicle to magnetically levitate relative to the rail, each of the plurality of magnet units being spaced by a corresponding gap from the rail and comprising at least one electro-magnet and at least one permanent magnet;
   mounting means for mounting the plurality of magnet units on the vehicle including movably mounting at least one of the plurality of magnet units relative to the vehicle so that the corresponding gap between each movably mounted magnet unit and the rail is adjustable;
   actuating means for adjusting the corresponding gap between each movably mounted magnet unit and the rail;
   gap detecting means arranged on or near each of the plurality of magnet units for detecting the corresponding gap between the rail and each magnet unit and producing an output in response thereto;
   current calculating means for calculating a current supplied to each of the plurality of magnet units in response to the output of the gap detecting means; and
   control means for controlling the actuating means based on the current supplied to the magnet units.

2. An apparatus according to claim 1, wherein a battery is arranged on the vehicle for driving the at least one electro-magnet of each magnet unit.

3. An apparatus according to claim 2, wherein each magnet unit comprises at least one central permanent magnet having opposite sides and two electro-magnets, one of the electro-magnets positioned on each of the opposite sides of the central permanent magnet, respectively, so that the central permanent magnet and electro-magnets are arranged in a U-shape.

4. An apparatus according to claim 1, wherein the plurality of magnet units includes four magnet units arranged on the vehicle so that the four magnet units form a quadrilateral arrangement.

5. An apparatus according to claim 1, wherein each of the electro-magnets has a coil to which a current is supplied in one direction or in a different direction depending on the corresponding gap between the respective magnet unit and the rail.

6. An apparatus according to claim 5, wherein the current calculating means has a feedback input at which the current calculating means receives, as feedback, the current supplied to each magnet unit, the current calculating means controlling the current supplied to each magnet unit so that the corresponding gap between each magnet unit and the rail becomes a value which indicates that a portion of the vehicle is substantially supported by only the magnetic force of the permanent magnet of each magnet unit.

7. An apparatus according to claim 6, wherein the control means controls the actuating means to move each movably mounted magnet unit when the current supplied to each of the remaining magnet units is lower than a predetermined value, and for simultaneously reducing the current supplied to each movably mounted magnet unit to zero.

8. An apparatus according to claim 7, wherein the control means causes each movably mounted magnet unit to move by a distance $\Delta L$, with the relationship of $\Delta L = P_1 i^3 + P_2 i^2 + P_3 i$, where i is the current supplied to the respective movably mounted magnet unit, and $P_1$, $P_2$, $P_3$ are constants.

9. An apparatus according to claim 5, wherein the actuating means comprises a piezoelectric actuator.

* * * * *

UNITED STATES PATENT AND TRADEMARK OFFICE
CERTIFICATE OF CORRECTION

PATENT NO. : 5,360,470
DATED : November 1, 1994
INVENTOR(S) : Yoshinobu ONO, et al.

It is certified that error appears in the above-indentified patent and that said Letters Patent is hereby corrected as shown below:

Col. 6, line 37, change "shogun" to --shown--.

Signed and Sealed this

Twentieth Day of December, 1994

Attest:

BRUCE LEHMAN

*Attesting Officer*     *Commissioner of Patents and Trademarks*